US012787276B2

(12) United States Patent
Mun et al.

(10) Patent No.: US 12,787,276 B2
(45) Date of Patent: Nov. 3, 2026

(54) CIRCUIT STRUCTURE AND RELATED MULTI-TIME PROGRAMMABLE (MTP) MEMORY CELL

(71) Applicant: GlobalFoundries Singapore Pte. Ltd., Singapore (SG)

(72) Inventors: Bong Woong Mun, Singapore (SG); Jeoung Mo Koo, Singapore (SG)

(73) Assignee: GLOBALFOUNDRIES SINGAPORE PTE LTD, Singapore (SG)

( * ) Notice: Subject to any disclaimer, the term of this patent is extended or adjusted under 35 U.S.C. 154(b) by 1269 days.

(21) Appl. No.: 17/694,846

(22) Filed: Mar. 15, 2022

(65) Prior Publication Data

US 2023/0301087 A1 Sep. 21, 2023

(51) Int. Cl.
*H10B 41/60* (2023.01)

(52) U.S. Cl.
CPC .................................... *H10B 41/60* (2023.02)

(58) Field of Classification Search
CPC ....... H01L 29/788; H10D 30/68; H10B 41/60
See application file for complete search history.

(56) References Cited

U.S. PATENT DOCUMENTS 5,998,264 A 12/1999 Wu
7,102,188 B1 * 9/2006 Yao .................... G11C 16/0433 257/E27.071
10,830,731 B1 * 11/2020 Cai ...................... G01N 27/414
11,659,709 B2 * 5/2023 Cai ........................ H10B 41/30 257/300
2002/0008271 A1 * 1/2002 Hsu .......................... G11C 7/20 257/311
2008/0083942 A1 * 4/2008 Terzioglu ............... H10B 69/00 257/315
2008/0130366 A1 * 6/2008 Ueda ...................... H10B 41/60 257/E27.103
2010/0165746 A1 * 7/2010 Jung .................. G11C 16/0416 438/258
2012/0156842 A1 * 6/2012 Jung ...................... H10B 41/60 257/E21.409
2015/0001608 A1 * 1/2015 Tan ...................... H10D 30/681 257/321
2015/0069483 A1 * 3/2015 Chen ...................... H10B 41/60 257/298
2018/0083008 A1 * 3/2018 Guo ....................... H10B 41/60
2019/0312046 A1 * 10/2019 Heryanto ............... H10B 41/30
2020/0365740 A1 * 11/2020 Liang ................. G11C 16/0408
2021/0280592 A1 * 9/2021 Chen .................. G11C 16/0441
2021/0384204 A1 * 12/2021 Cai ........................ H10B 41/10
(Continued)

FOREIGN PATENT DOCUMENTS

CN 101106134 A * 1/2008 ............. H10B 69/00

*Primary Examiner* — Scott B Geyer
(74) *Attorney, Agent, or Firm* — Yee Tze Lim; Hoffman Warnick LLC

(57) ABSTRACT

Embodiments of the disclosure provide a circuit structure and related multi-time programmable (MTP) memory cell. The circuit structure may include a transistor having a floating gate over a semiconductor channel and a control gate on the dielectric layer. The control gate is electrically coupled to a word line. The control gate is capacitively coupled to the floating gate. A metal-insulator-metal (MIM) capacitor includes a first electrode coupled to the word line and a second electrode coupled to the floating gate of the transistor.

20 Claims, 5 Drawing Sheets

(56) References Cited

U.S. PATENT DOCUMENTS

| | | | | |
|---|---|---|---|---|
| 2022/0059554 | A1* | 2/2022 | Cai | H10D 64/035 |
| 2022/0068878 | A1* | 3/2022 | Ma | H10B 41/40 |
| 2023/0111804 | A1* | 4/2023 | Sandhu | G11C 16/045<br>257/315 |
| 2023/0116512 | A1* | 4/2023 | Sandhu | G11C 11/5635<br>257/315 |

* cited by examiner

CIRCUIT STRUCTURE AND RELATED MULTI-TIME PROGRAMMABLE (MTP) MEMORY CELL

BACKGROUND

The present disclosure relates to circuit structures, e.g., for multi-time programmable (MTP) memory. Conventional circuit structures for memory cells may incorporate various capacitive couplings between electrically active elements. Such capacitive couplings may enable incoming data to be written to selected portions of the memory cell. An existing low-cost solution to provide the desired capacitance includes the use of capacitors formed of polycrystalline silicon. However, such components typically occupy significant surface area as compared to other capacitive elements. Other types of capacitors have been considered for such applications but may substantially increase manufacturing costs and/or lower than desired levels of capacitance.

SUMMARY

The illustrative aspects of the present disclosure are designed to solve the problems herein described and/or other problems not discussed.

Embodiments of the disclosure provide a circuit structure including: a transistor on a substrate, the transistor including: a floating gate over a semiconductor channel, a control gate electrically coupled to a word line, and capacitively coupled to the floating gate; and a metal-insulator-metal (MIM) capacitor having a first electrode coupled to the word line and a second electrode coupled to the floating gate of the transistor.

Other embodiments of the disclosure provide a multi-time programmable (MTP) memory cell, including: a word line for transmitting data signals; a transistor including: a floating gate over a semiconductor channel, a control electrically coupled to the word line and capacitively coupled to the floating gate, and a source/drain (S/D) terminal coupled between the semiconductor channel and a bit line; and a metal-insulator-metal (MIM) capacitor having a first electrode coupled to the word line and a second electrode coupled to the floating gate of the transistor.

Additional embodiments of the disclosure provide a multi-time programmable (MTP) memory cell, including: a plurality of word lines for transmitting data signals; a plurality of transistors each coupled to one of the plurality of word lines, and further including: a floating gate over a semiconductor channel, a control gate electrically coupled to a selected one of the plurality of word lines, and capacitively coupled to the floating gate, and a source/drain (S/D) terminal coupled between the semiconductor channel and a bit line; and a plurality of metal-insulator-metal (MIM) capacitors each having a first electrode coupled to the selected one of the plurality of word lines and a second electrode coupled to the floating gate of a selected one of the plurality of transistors.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
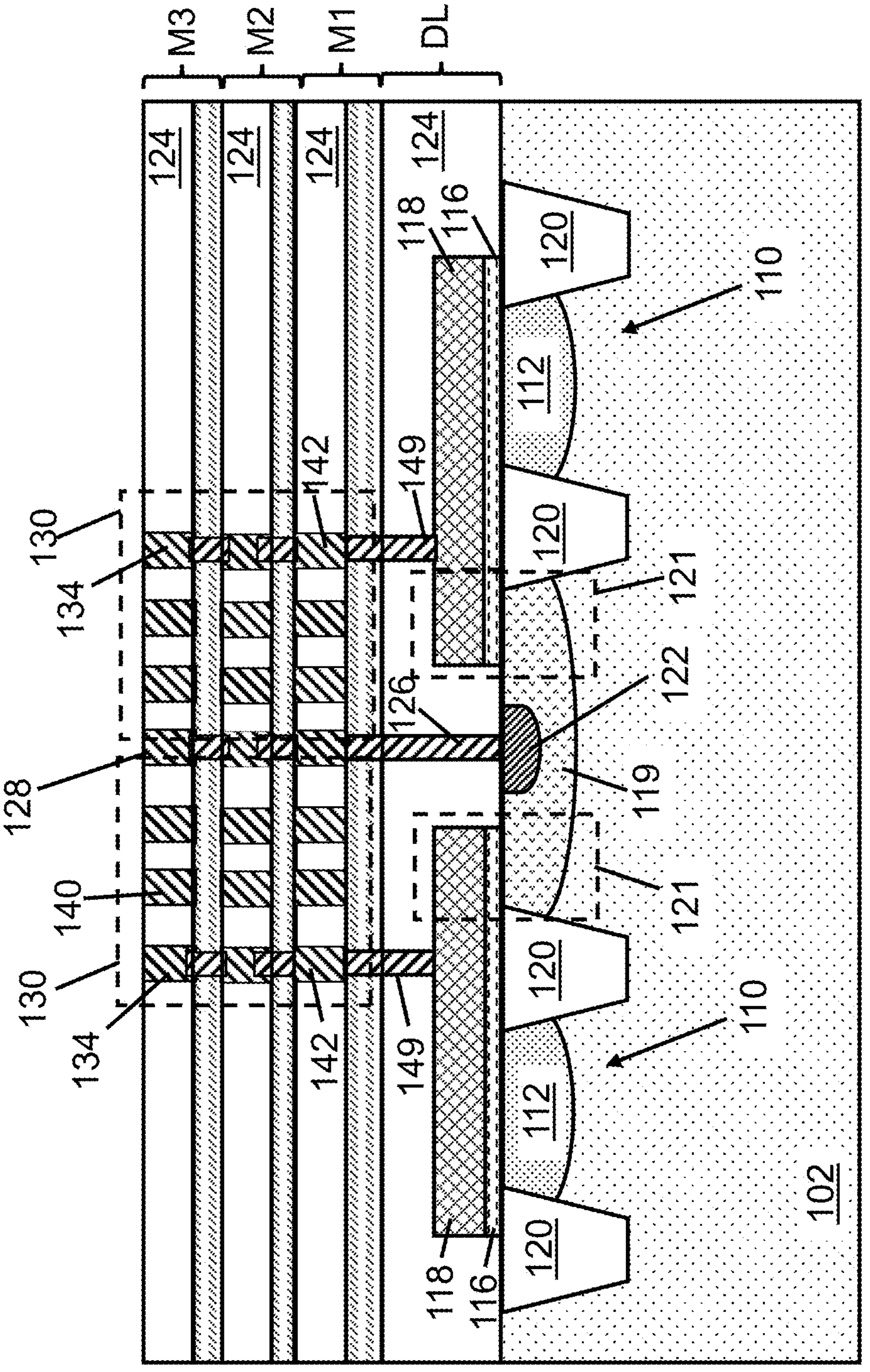
FIG. 1 provides a cross-sectional view of a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a circuit structure and related multi-time programmable memory (MTP) cell. MTP memory cells are a type of non-volatile memory that, after having data recorded therein, may be programmed and reprogrammed as many times as a user desires without appreciable loss in operability. Being non-volatile memory, MTP memory cells will retain their data even after a device is turned off and on again. To provide this ability, MTP memory cells may rely on non-volatile programmable elements. A circuit structure according to the disclosure includes a combination of capacitive elements, e.g., floating-gate metal oxide field effect transistors (MOSFETs) and capacitors to provide non-volatile programming while also limiting surface area occupied by the memory cell components. A floating-gate MOSFET refers to a transistor device in which a first ("floating") gate conductor (e.g., metal or doped semiconductor material(s)) is over a semiconductor channel region and capacitively coupled to a second ("control") gate conductor. Dielectric material, such as a gate dielectric layer, may electrically separate the two gate conductors and thereby form two capacitive junctions. Applying a voltage of sufficient magnitude to the second gate conductor may selectively enable or disable electrical conductivity in the semiconductor channel region, and the presence of the capacitive junctions causes the transistor to maintain its selected state even when the device is powered off.

Embodiments of the disclosure provide a circuit structure and related multi-time programmable (MTP) memory cell. The circuit structure may include a transistor, e.g., floating-gate MOSFET, having a floating gate over a semiconductor channel, and a control gate capacitively coupled to the floating gate. The control gate is electrically coupled to a word line. The capacitive coupling between the control gate and floating gate may be, e.g., through a gate dielectric layer in the case where the control gate includes doped semiconductor material that is isolated from the semiconductor channel. The structure also includes a metal-insulator-metal (MIM) capacitor in which a first electrode is coupled to the word line and a second electrode is coupled to the floating gate of the transistor. The MIM capacitor may be included within a layer of the device that is above the transistor, e.g., a local interconnect (LI) layer, a metal level layer, and/or other back end of line (BEOL) layers of a device. Embodiments of the disclosure also may provide an MTP memory cell including one or more of such circuit structures, each coupled to one or more respective word lines and bit lines to enable programming of data to the transistor(s) in the memory cell(s).

FIG. 1 provides a cross-sectional view of a circuit structure (simply "structure" hereafter) 100 according to embodiments of the disclosure. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Structure 100 may include a transistor 110 (i.e., an electrically controlled switch) on substrate 102. Transistor 110 may be in the form of, e.g., a floating-gate MOSFET with multiple gates and thus may be able to remain in an "on" state or "off" state after a device is turned off and then back on. Transistor 110 may include a channel region 112 of substrate 102 that is located between a set of source/drain (S/D) regions 114 (FIGS. 4, 5) of substrate 102, positioned in front of or behind channel region 112 with respect to the plane of the page. Channel region 112 may be lightly doped (e.g., it may have the same doping polarity and/or concentration as other portions of substrate 102), whereas S/D regions 114 may be highly doped to a predetermined polarity and/or concentration. Differences in cross hatching indicate the approximate boundary between substrate 102 and channel region 112, but these two elements may have the same composition and thus may be indistinguishable apart from their positions. A stack various materials formed over channel region 112, and discussed herein, can allow or prohibit electrical conduction from one S/D region 114 to another through channel region 112.

A gate dielectric layer 116 may be on channel region 112, and a floating gate 118 may be on gate dielectric layer 116. Gate dielectric layer 116 may include materials such as, without limitation: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), other currently known or later developed high-k dielectric material, or any combination of these materials. Floating gate 118 may include any currently known or later developed gate conductor material, and/or a stack of such materials on gate dielectric layer 116. Floating gate 118 thus may include, e.g., polycrystalline semiconductor materials (e.g., polysilicon), and/or various high work function metals adapted for use in the conductive portion of a gate structure.

Substrate 102 may include, e.g., a trench isolation (TI) region 120 that is adjacent channel region 112. Trench isolation region 120 may be included within an intermediate region that is horizontally between distinct electrically active components and may have a relatively larger vertical thickness (e.g., at least approximately six-hundred nanometers (nm)) as compared to the active material(s) that it abuts. Trench isolation region 120 may be embodied as, or may include portions of, a shallow trench isolation (STI) region for horizontally separating distinct regions of active material. In some cases, multiple TIs 120 may be formed over substrate 102 and/or regions of different vertical thickness may be formed. Each TI 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

A doped well 119 may be located within substrate 102, e.g., in an area that is horizontally separated from channel region(s) 112 by TI(s) 120. Doped well 119 may be included on or within substrate 102, e.g., to enable electrical a capacitive coupling between doped well 119 and portions of floating gate 118 thereover, thereby defining a control gate 121 that is capacitively coupled to floating gate 118. Doped well 119 may have an opposite doping type (e.g., N type doping) as compared with substrate 102 and/or channel region 112, and may have a higher dopant concentration therein to enable electrical conduction. One or more portions of doped well 119 may include a highly doped region 122 that has the same doping polarity as doped well 119, but in a substantially higher concentration to facilitate biasing through one or more electrical contacts formed thereon.

Gate dielectric layer 116 may capacitively couple doped well 119 to floating gate 118, thereby defining a control gate 121. Applying a voltage to control gate 121 can affect the voltage within floating gate 118, thereby controlling whether channel region 112 is conductive or non-conductive. In this configuration, a portion of the material composition of floating gate 118 may be separately designated as being a portion of control gate 121.

Thus, floating gate 118 and doped well 119, via control gate 121, may define the two terminals of a capacitor within transistor 110. Gate dielectric layer 116, floating gate 118, and/or other conductive materials over substrate 102 may be within an inter-level dielectric (ILD) layer 124 for a device layer ("DL") of structure 100. ILD layer(s) 124 may include, as example: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Control gate 121 of transistor 110 may be electrically coupled to a gate contact 126 extending vertically through a local interconnect ("L1") layer, and optionally through one or more metal level layers (two separately labeled "M1, "M2" in FIG. 1) for electrically coupling a word line 128 (e.g., one or more metal wires) to control gate 121. Each layer L1, M1, M2 of structure 100 may include its own region of ILD layer 124 with various conductive materials being located therein. Gate contact 126 may include any currently known or later developed material to form a conductive electrical pathway, e.g., tungsten (W), copper (Cu), aluminum (Al), etc. Gate contact 126 may additionally include refractory metal liners (not shown) positioned alongside ILD layer 124 to prevent electromigration degradation, shorting to other components, etc. Word line 128 may be any currently known or later developed wire or other conductor suitable for transmitting data signals (i.e., high voltage and low voltage pulses indicative of logic levels) to be recorded in memory via transistor 110. Word line(s) 128, in addition or alternatively to extending from left to right as shown in FIG. 1, may extend laterally into or out of the plane of the page.

Structure 100 additionally includes a metal-insulator-metal (MIM) capacitor 130 that electrically couples floating gate 118 of transistor 110 to word line 128. MIM capacitor 130 may include alternating layers of metal, insulative layer, and metal materials to thus function as a capacitor and diode within structure 100. The insulative layer within MIM capacitor 130 may include any conceivable dielectric material, e.g., silicon nitride (SiN), oxides such as silicon oxide ($SiO_2$), etc. In cases where an oxide material is used within the insulative layer(s), MIM capacitor 130 may be known as or referred to as a metal-oxide-metal ("MOM") capacitor. MOM capacitors may be preferable in some cases, e.g., because they may be fabricated within an existing metal level layer without requiring an additional mask and processing, whereas other types of MIM capacitors suitable for use as MIM capacitor 130 may be formed using an additional mask. In the following description, MIM capacitor 130 is depicted and discussed by example as an MOM capacitor, but it is understood that other types of capacitors may be used. However embodied, MIM capacitor 130 or portions thereof may be located entirely within one metal level layer of structure 100 or may be distributed across multiple metal levels (e.g., within metal levels M1, M2, M3 as shown by example in FIG. 1). One terminal of MIM capacitor 130 may be coupled to floating gate 118 while the other, opposite terminal of MIM capacitor 130 may be coupled to word line 128. MIM capacitor 130 thus capacitively couples floating gate 118 to word line 128 in parallel with the capacitive coupling of floating gate 118 to control gate 121 within transistor 110. Nonetheless, control gate 121 and MIM capacitor 130 each may be coupled to different portions of word line 128 and thus are coupled to the same node in an electronic circuit.

Figure 2:
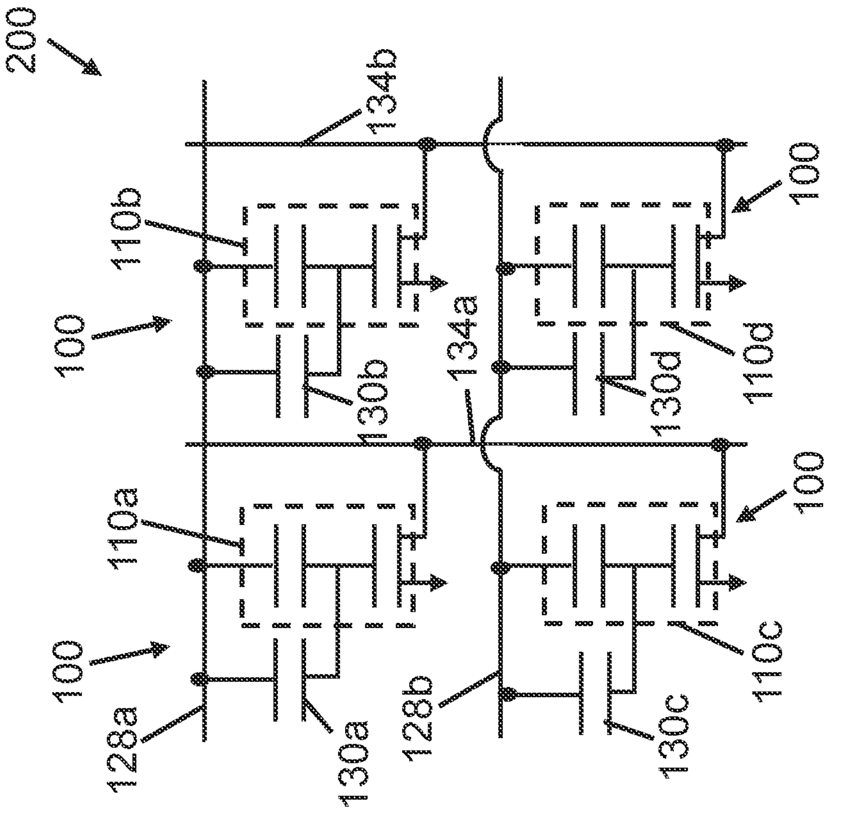
FIG. 2 provides a schematic view of a memory cell according to embodiments of the disclosure.

FIG. 2 depicts a multi-time programmable memory (MTP) cell 200 which may include multiple transistors 110 (four labeled 110*a*, 110*b*, 110*c*, 110*d*, respectively), word lines 128 (two labeled 128*a*, 128*b*, respectively) and MIM capacitors 130 (four labeled 130*a*, 130*b*, 130*c*, 130*d*, respectively) therein. Although four transistors 110, two word lines 128, four MIM capacitors 130, and two bit lines 134 are shown in MTP memory cell 200, it is understood that MTP memory cell 200 may include any desired number of these components (e.g., hundreds or thousands or more). Word lines 128 of MTP memory cell 200 each may have a group of transistors 110 coupled thereto, and a group of MIM capacitors 130 coupled between one word line 128 and floating gate 118 (FIG. 1) of transistor 110.

MTP memory cell 200 also may include a set of bit lines 134 (two labeled 134*a*, 134*b*, respectively) for transmitting data to S/D regions 114 (FIG. 1) of transistor(s) 110. During operation, word lines 128*a*, 128*b* may transmit signals for turning respective transistor(s) 110 on or off. The signal for activating or deactivating each transistor 110 may be transmitted to its control gate 121 (FIG. 1) directly, and to its floating gate 118 in parallel with control gate 121 through a corresponding MIM capacitor 130. In this configuration, MIM capacitor 130 increases the capacitance of the electrical coupling between word line 128 and floating gate 118 of transistor 110. A greater amount of capacitance, in turn, allows transistors 110 to be viable as non-volatile memory elements within MTP memory cell 200.

Figure 3:
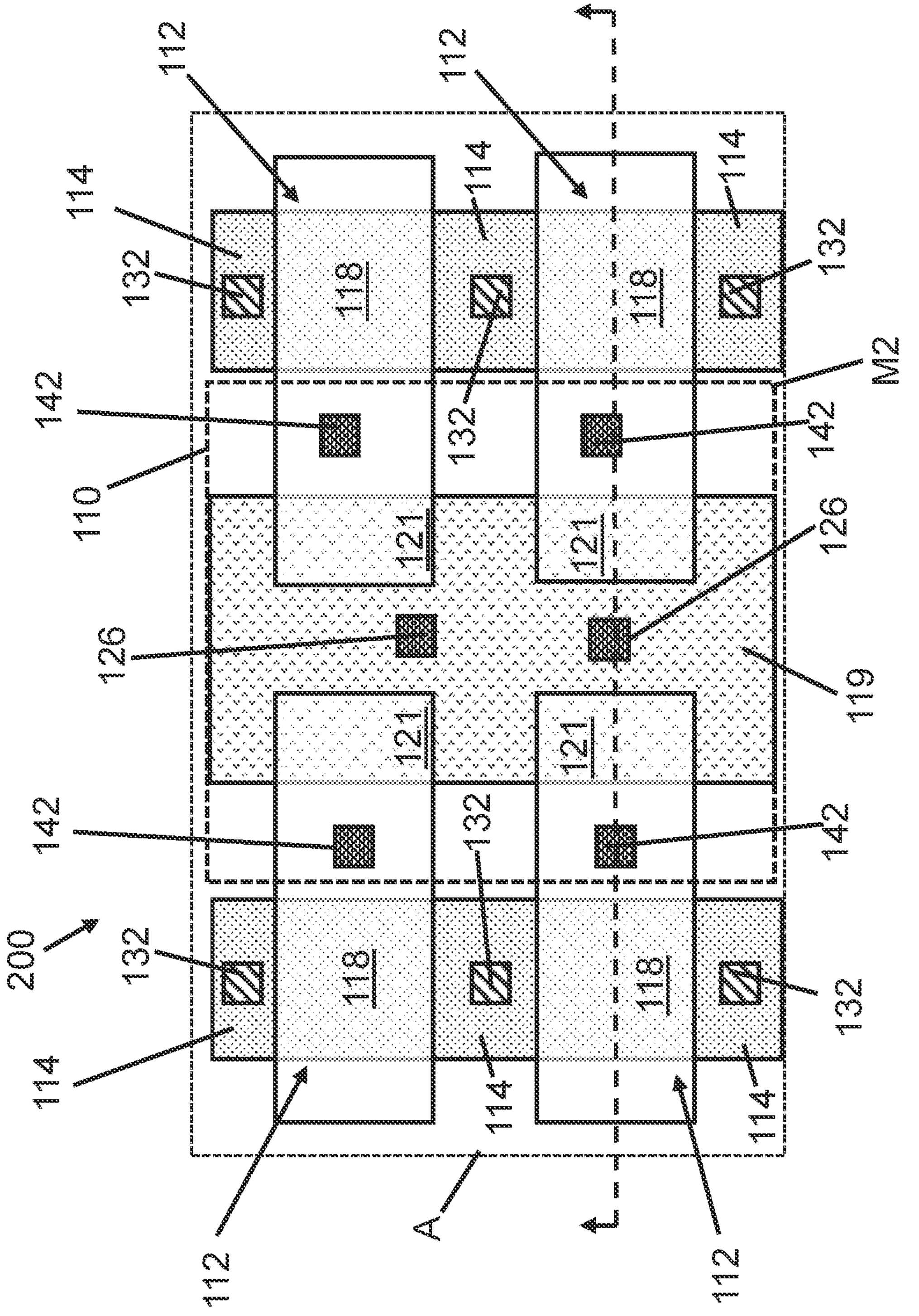
FIG. 3 provides a first plan view of a device layer in a circuit structure according to embodiments of the disclosure.

FIG. 3 depicts a plan view of MTP memory cell 200 to illustrate how embodiments of structure 100 and MTP memory cell 200 may be within a surface area that is smaller than conventional MTP memory cells that lack additional capacitive elements and/or floating gate MOSFETs. The plan view of MTP memory cell 200 depicts a surface area of at most approximately 1.70 square micrometers ($\mu m^2$). In the illustrated example, MTP memory cell 200 may be distributed over an area A having a width of approximately one μm by one and a half μm. The plan view of MTP memory cell 200 includes a dashed line indicating elements within an overlying metal level (e.g., metal level layer M2) and elements included therein. Control gate 121 (FIG. 1) may be above the position of floating gate 118 in FIG. 3, but control gate 121 is omitted for clarity of illustration.

S/D regions(s) 114 of transistor 110 each may be electrically coupled to an S/D contact 132 extending vertically through local interconnect ("L1") layer (FIG. 1). One or more of S/D contacts 132 may extend through one or more metal level layers for electrical coupling to bit line(s) 134 (FIGS. 1, 2). Other S/D contacts 132 may be coupled to other components or elements, e.g., other transistors, grounded nodes, etc. S/D contact 132 may include the same material and/or similar materials to those within gate contact 126 but may be taller due to the lower position of S/D region(s) 114. Bit line(s) 134 may be in the same metal level layer as word line 128 (e.g., metal level M2) or a different metal level layer. Bit line(s) 134 nonetheless may be electrically decoupled from word line 128 and may be configured to transmit a voltage through S/D region(s) 114 sufficient for writing or reading of data in transistor 110. The electrical process(es) for reading or writing of data in transistor 110 via word line 128 and bit line 134 are generally understood in the art and thus not discussed in further detail, except where relevant to describe the structure and operation of structure 100 and/or transistor 110.

Figure 4:
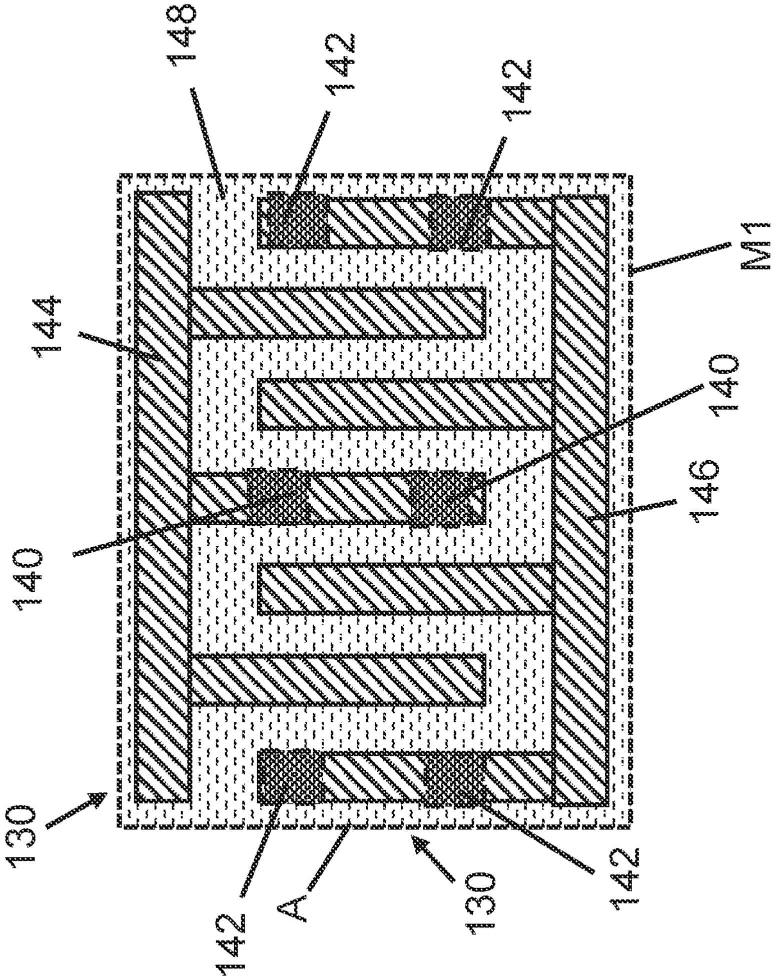
FIG. 4 provides a plan view of a metal level layer in a circuit structure according to embodiments of the disclosure.

Referring to FIGS. 1, 3 and 4 together, FIG. 3 depicts portions of MTP memory cell 200, and FIG. 4 depicts a second plan view illustrating MIM capacitor 130. As shown in FIG. 1, word line 128 may be coupled to a set of first electrodes 140 for vertical coupling of word line 128 to MIM capacitor 130. Similarly, a set of second electrodes 142 may vertically couple respective floating gates 118 to MIM capacitor 130. The corresponding couplings of first electrodes 140 and second electrodes 142 to portions of MIM capacitor 130 are shown in FIG. 4. MIM capacitor 130 optionally may be entirely within a single metal level (e.g., metal level layer M1) while being coupled to active elements outside the metal level layer and may be distributed over a surface area that is at most equal to the surface area of MTP memory cell 200 in other layers. Thus, MIM capacitor 130 may be within surface area A that is at most approximately 1.70 $\mu m^2$, e.g., having a width of approximately one μm by one and a half μm. MIM capacitor 130 may include, e.g., a first conductor 144 and a second conductor 146 that are separated from each other by a region of dielectric material 148. Conductors 144, 146 and insulative material may be wholly within the single metal level (e.g., metal level layer M1 as shown), but this is not necessarily required in all implementations. As illustrated, first conductor 144 and second conductor 146 each may include a plurality of conductive fingers configured in a comb arrangement to increase the surface area in which charge may be stored within dielectric material 148 between conductors 144, 146. However, other arrangements, shapes, sizes, etc., are possible. In the illustrated arrangement, first conductor 144 includes several finger-shaped protrusions interleaved with similar finger-shaped protrusions of second conductor 146, i.e., they may mesh like the fingers of two clasped hands without interlocking, Second electrode 142 may be coupled to floating gate 118, e.g., through a capacitor contact 149 that extends vertically between electrode 142 and gate 118. Capacitor contact 149 may include the same material and/or similar materials to those within gate contact 126. Such an arrangement may cause MINI capacitor 130 to have a significantly greater capacitance than the junction bet floating gate 118 and control gate 121 in transistor 110, For example, MIM capacitor may have a capacitive density of at least approximately 4.25 femtofarads (fF) per $\mu m^2$, whereas the junction between floating gate 118 and control gate 121 may have a capacitive density of approximately 2.9 fF/$\mu m^2$.

Figure 5:
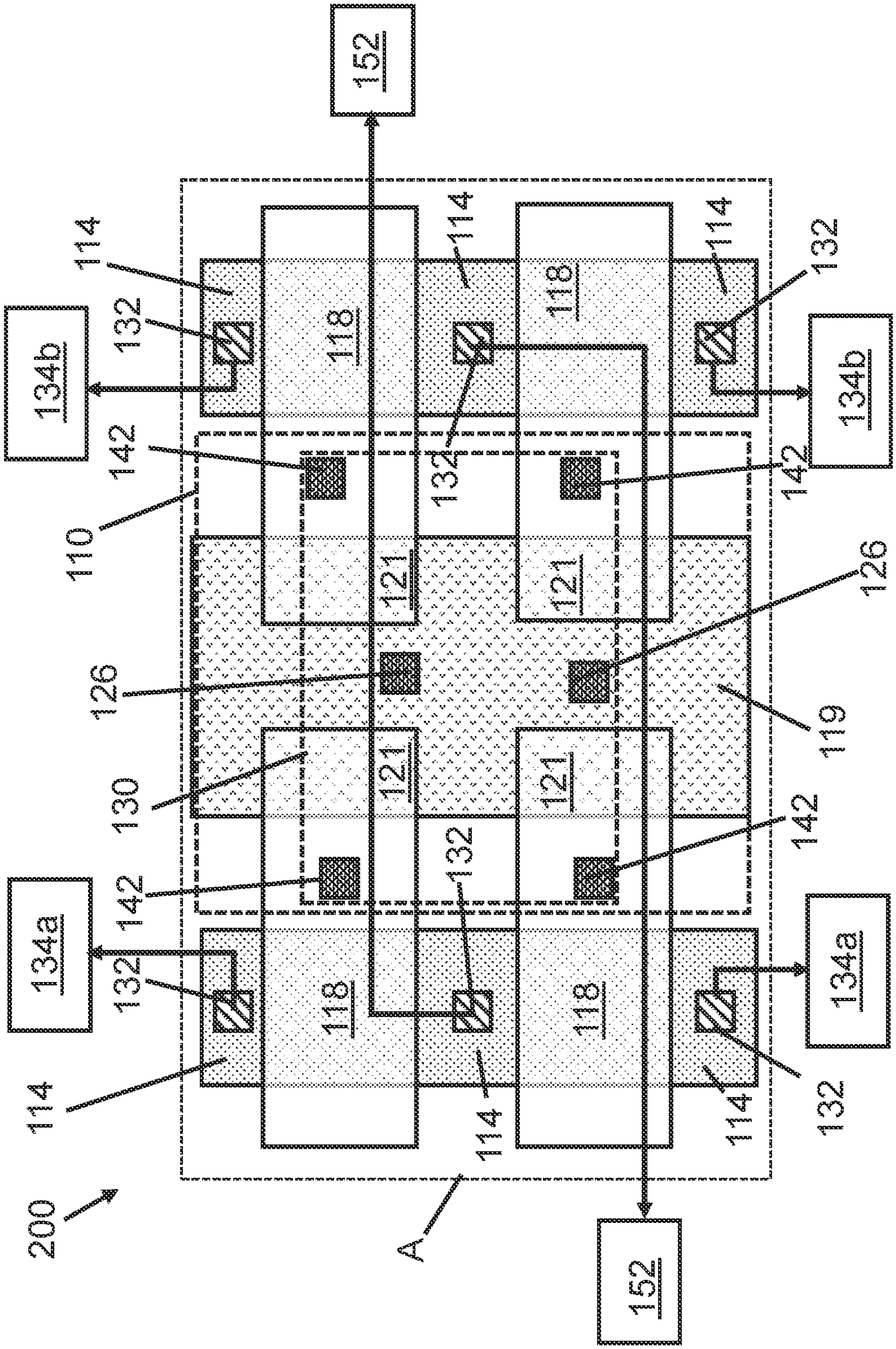
FIG. 5 provides a second plan view of a device layer in a circuit structure with an overlay indicating a position of the metal level layer according to embodiments of the disclosure.

FIG. 5 provides an annotated plan view of MTP memory cell 200 to illustrate electrical couplings to other elements within MTP memory cell 200 (e.g., those illustrated in FIG. 2). As discussed elsewhere herein, any word line 128 (e.g., word line(s) 128a, 128b) may be coupled to first electrode 140 for electrical coupling to MIM capacitor 130. Second electrode of MIM capacitor 130 in turn may be coupled to floating gate 118, such that MIM capacitor 130 is within the electrical pathway from word line(s) 128 to floating gate 118. In addition, control gate(s) 121 and gate contact(s) 126 thereto (shown in dashed lines) can be located over floating gate(s) 118 at various positions such that they are capacitively coupled thereto. One or more of bit lines 134*a*, 134*b* where applicable may be coupled to S/D region(s) 114 of transistor(s) 110 such that the voltage in floating gate 118 controls whether data may pass through channel region 112 and S/D regions 114 to reach an electrical coupling 150 (e.g., another contact) to external circuitry 152, e.g., a wire coupled to external device where data is to be used and/or another element such as a grounding portion of the circuit. External circuitry 152 thus may be in any desired metal level of a device, e.g., M1, M2, or other metal level layers not shown.

Embodiments of the disclosure may provide various technical and commercial advantages as compared to other memory cells, including conventional MTP memory cell circuitry. For example, the use of MIM capacitor 130 allows additional capacitive elements to be formed within metal level layers overlying the device layer, thus maintaining the surface area of the electrically active semiconductor components within desired limits. Additionally, the use of MIM capacitor(s) 130 in such locations improves manufacturability over other types of MTP memory cells because conventional processes to form transistor 110 as a floating gate MOSFET may be used without changes in manufacturing processes to form the device layer. Despite these benefits to manufacturability, MTP memory cell 200 according to the disclosure may provide better performance than other types of MTP memory cells 200, e.g., those which do not incorporate a parallel configuration of MIM capacitors 130 and transistors 110. Furthermore, embodiments of the disclosure can easily be scaled for use in many types of devices, e.g., by accommodating the addition or removal of transistors 110 and MIM capacitors 130 in various locations where needed.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure comprising:
- a transistor on a substrate, the transistor including:
  - a floating gate over a semiconductor channel,
  - a control gate electrically coupled to a word line, and capacitively coupled to the floating gate; and
- a metal-insulator-metal (MIM) capacitor having a first electrode coupled to the word line and a second electrode coupled to the floating gate of the transistor.

2. The circuit structure of claim 1, wherein the MIM capacitor includes a plurality of conductive fingers within a metal level interleaved with an insulative material within the metal level.

3. The circuit structure of claim 1, wherein the transistor further includes a source/drain (S/D) terminal electrically coupled between the semiconductor channel and a bit line.

4. The circuit structure of claim 1, wherein the control gate of the transistor includes a polycrystalline semiconductor material.

5. The circuit structure of claim 1, wherein a capacitance of the MIM capacitor is greater than a capacitance between the control gate and the floating gate.

6. The circuit structure of claim 1, wherein the transistor is one of a plurality of transistors coupled to one of a plurality of word lines within a multi-time programmable (MTP) memory cell.

7. The circuit structure of claim 6, wherein the MIM capacitor is one of a plurality of MIM capacitors in the MTP memory cell, each of the MIM capacitors being electrically coupled between one of the plurality of word lines and a floating gate of one of the plurality of transistors.

8. A multi-time programmable (MTP) memory cell, comprising:
- a word line for transmitting data signals;
- a transistor including:
  - a floating gate over a semiconductor channel,
  - a control gate electrically coupled to the word line and capacitively coupled to the floating gate, and
  - a source/drain (S/D) terminal coupled between the semiconductor channel and a bit line; and
- a metal-insulator-metal (MIM) capacitor having a first electrode coupled to the word line and a second electrode coupled to the floating gate of the transistor.

9. The MTP memory cell of claim 8, wherein the MIM capacitor includes a plurality of conductive fingers within a metal level interleaved with an insulative material within the metal level.

10. The MTP memory cell of claim 8, wherein the control gate of the transistor includes a polycrystalline semiconductor material.

11. The MTP memory cell of claim 8, wherein a capacitance of the MIM capacitor is greater than a capacitance between the control gate and the floating gate.

12. The MTP memory cell of claim 8, wherein the transistor is one of a plurality of transistors coupled to one of a plurality of word lines within the (MTP) memory cell.

13. The MTP memory cell of claim 12, wherein the MIM capacitor is one of a plurality of MIM capacitors in the MTP memory cell, each of the MIM capacitors being electrically coupled between one of the plurality of word lines and a floating gate of one of the plurality of transistors.

14. The MTP memory cell of claim 13, the plurality of transistors and the plurality of MIM capacitors are within a surface area of at most approximately 1.70 square micrometers ($\mu m^2$).

15. A multi-time programmable (MTP) memory cell, comprising:
- a plurality of word lines for transmitting data signals;
- a plurality of transistors each coupled to one of the plurality of word lines, and further including:
  - a floating gate over a semiconductor channel,
  - a control gate electrically coupled to a selected one of the plurality of word lines, and capacitively coupled to the floating gate, and
  - a source/drain (S/D) terminal coupled between the semiconductor channel and a bit line; and
- a plurality of metal-insulator-metal (MIM) capacitors each having a first electrode coupled to the selected one of the plurality of word lines and a second electrode coupled to the floating gate of a selected one of the plurality of transistors.

16. The MTP memory cell of claim 15, wherein each of the plurality of MIM capacitors are included within a same metal level.

17. The MTP memory cell of claim 15, wherein the control gate of each of the plurality of transistors includes a polycrystalline semiconductor material.

18. The MTP memory cell of claim 15, wherein a capacitance of each of the plurality of MIM capacitors is greater than a capacitance of a junction between the control gate and the floating gate within each of the plurality of transistors.

19. The MTP memory cell of claim 15, wherein the plurality of word lines and the plurality of transistors are within a surface area of at most approximately 1.70 square micrometers ($\mu m^2$).

20. The MTP memory cell of claim 19, wherein the plurality of MIM capacitors are within the surface area of at most approximately 1.70 $\mu m^2$.

* * * * *